United States Patent
Kim et al.

(10) Patent No.: US 12,349,563 B2
(45) Date of Patent: Jul. 1, 2025

(54) DISPLAY DEVICE WITH MINIMIZED NON-DISPLAY PORTION IN BEZEL AREA

(71) Applicant: Samsung Display Co., LTD., Yongin-si (KR)

(72) Inventors: Tae Hoon Kim, Seoul (KR); Min Chae Kwak, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 602 days.

(21) Appl. No.: 17/551,337

(22) Filed: Dec. 15, 2021

(65) Prior Publication Data
US 2022/0328602 A1 Oct. 13, 2022

(30) Foreign Application Priority Data

Apr. 13, 2021 (KR) .......................... 10-2021-0047822

(51) Int. Cl.
*H10K 59/131* (2023.01)
*H10K 59/80* (2023.01)

(52) U.S. Cl.
CPC ....... *H10K 59/131* (2023.02); *H10K 59/8723* (2023.02)

(58) Field of Classification Search
CPC ............... H10K 59/131; H10K 59/122; H10K 59/8723; H10K 59/124; H10K 59/353
USPC ...................................... 257/40; 438/82, 99
See application file for complete search history.

(56) References Cited

U.S. PATENT DOCUMENTS

| | | | |
|---|---|---|---|
| 10,121,986 B2 | 11/2018 | Lee et al. | |
| 10,381,592 B2 | 8/2019 | Lee et al. | |
| 2014/0001966 A1 | 1/2014 | Cho | |
| 2016/0190166 A1* | 6/2016 | Kim | H01L 27/124 257/71 |
| 2017/0154945 A1* | 6/2017 | Shin | G09G 3/3266 |
| 2020/0144351 A1 | 5/2020 | Liu et al. | |
| 2020/0185428 A1* | 6/2020 | Um | H01L 27/1248 |
| 2020/0273940 A1 | 8/2020 | Byun et al. | |
| 2020/0335025 A1 | 10/2020 | Kim et al. | |
| 2020/0357878 A1 | 11/2020 | Jo et al. | |
| 2021/0083037 A1 | 3/2021 | Kim et al. | |

FOREIGN PATENT DOCUMENTS

| | | |
|---|---|---|
| EP | 3258496 A1 | 12/2017 |
| KR | 1020070047950 | 5/2007 |
| KR | 1020160063483 | 6/2016 |

(Continued)

*Primary Examiner* — Didarul A Mazumder
(74) *Attorney, Agent, or Firm* — CANTOR COLBURN LLP

(57) ABSTRACT

A display device includes a display area which displays a screen, an inner line disposed outside the display area, and extending to surround the display area, an outer line disposed outside the inner line, a contact pattern overlapping with the inner line and the outer line and electrically connecting the inner line and the outer line to each other, and a connection line disposed between the inner line and the outer line to electrically connect the inner line and the outer line to each other, a contact area where the contact pattern overlaps with the outer line and physically contact the outer line, and a non-contact area where the contact pattern overlaps with the outer line and does not physically contact the outer line. The connection line is disposed within the non-contact area.

23 Claims, 13 Drawing Sheets

(56) References Cited

FOREIGN PATENT DOCUMENTS

| KR | 1020170064123 | 6/2017 |
| KR | 1020180127605 | 11/2018 |
| KR | 101917853 | 1/2019 |
| KR | 1020190064091 | 6/2019 |
| KR | 1020200108152 | 9/2020 |
| KR | 1020200130544 | 11/2020 |

\* cited by examiner

【FIG. 1】
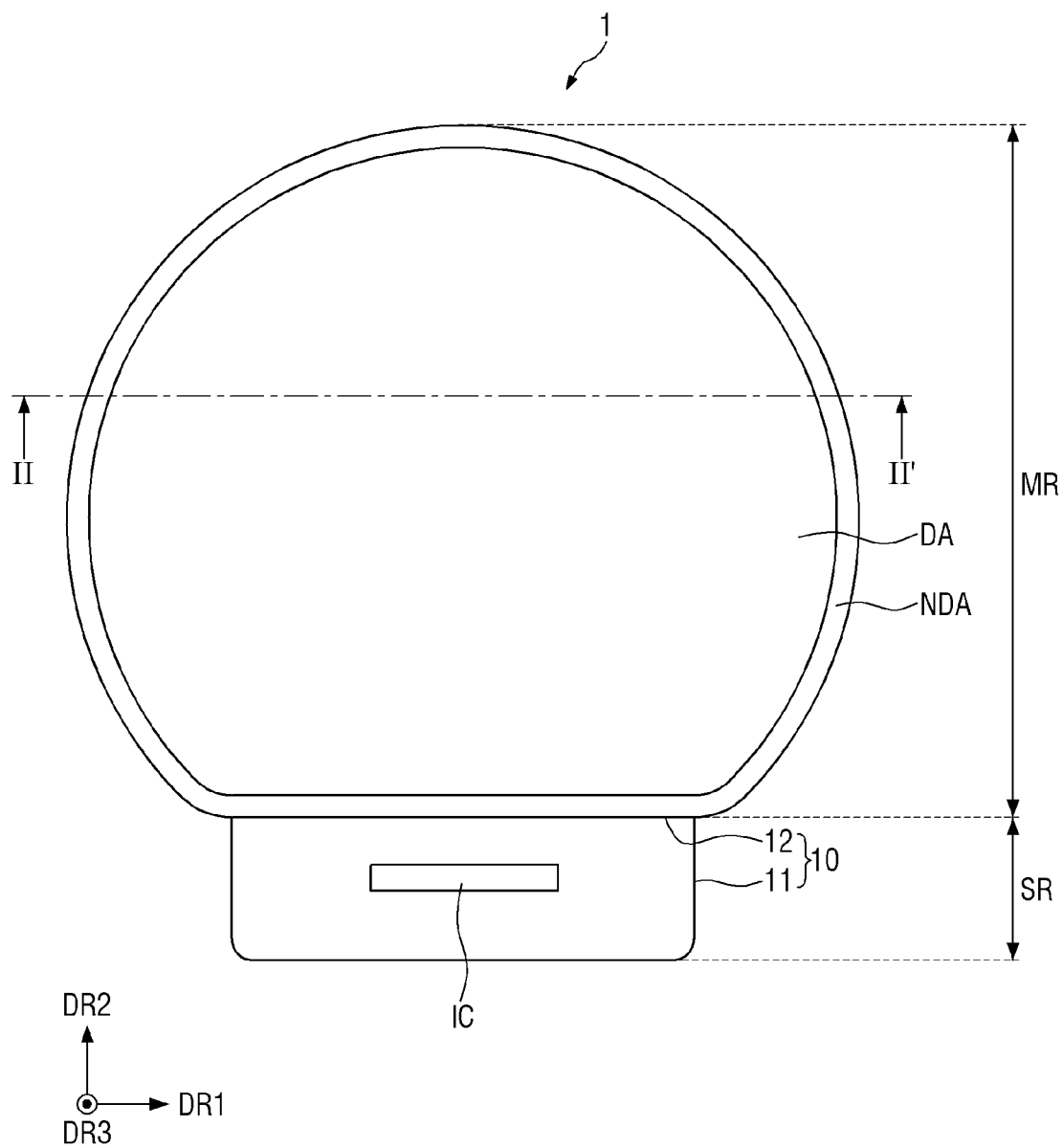

[FIG. 2]
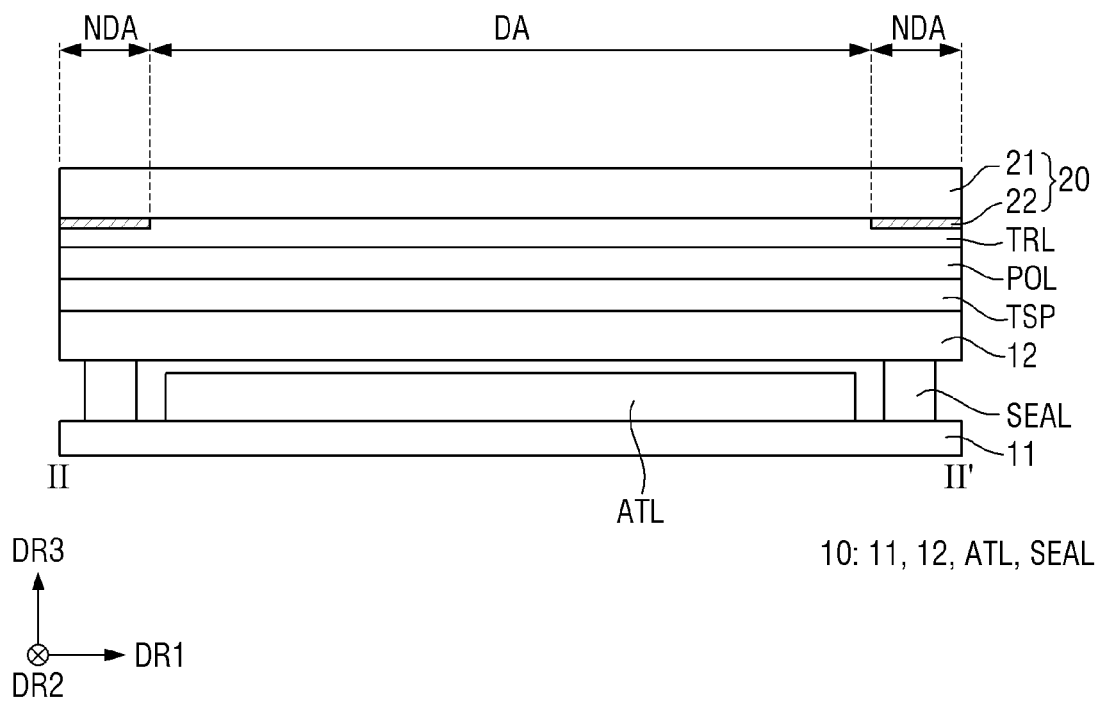

[FIG. 3]
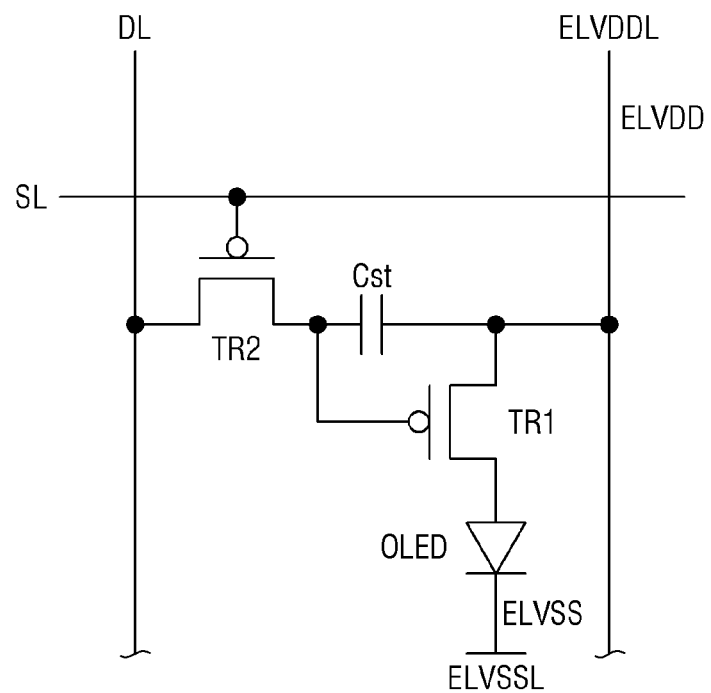

[FIG. 4]
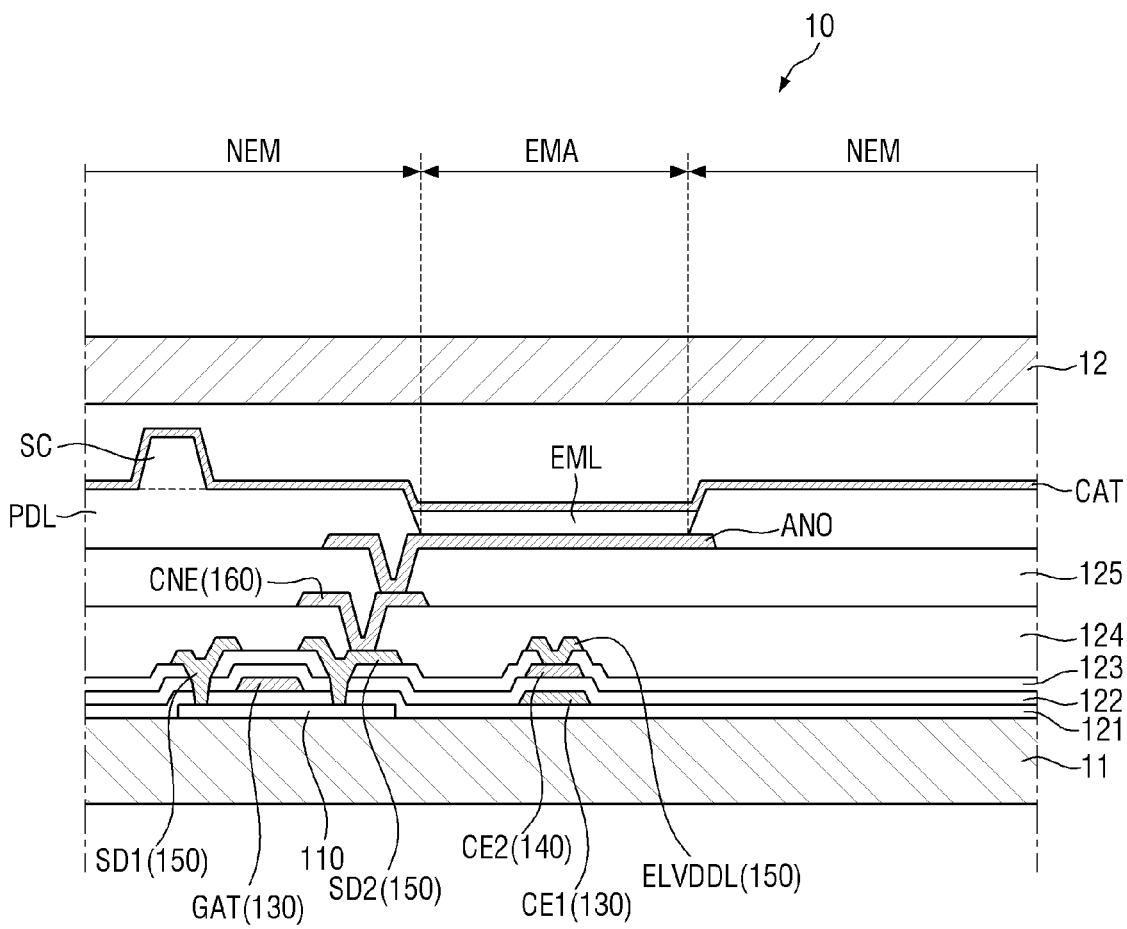

[FIG. 5]
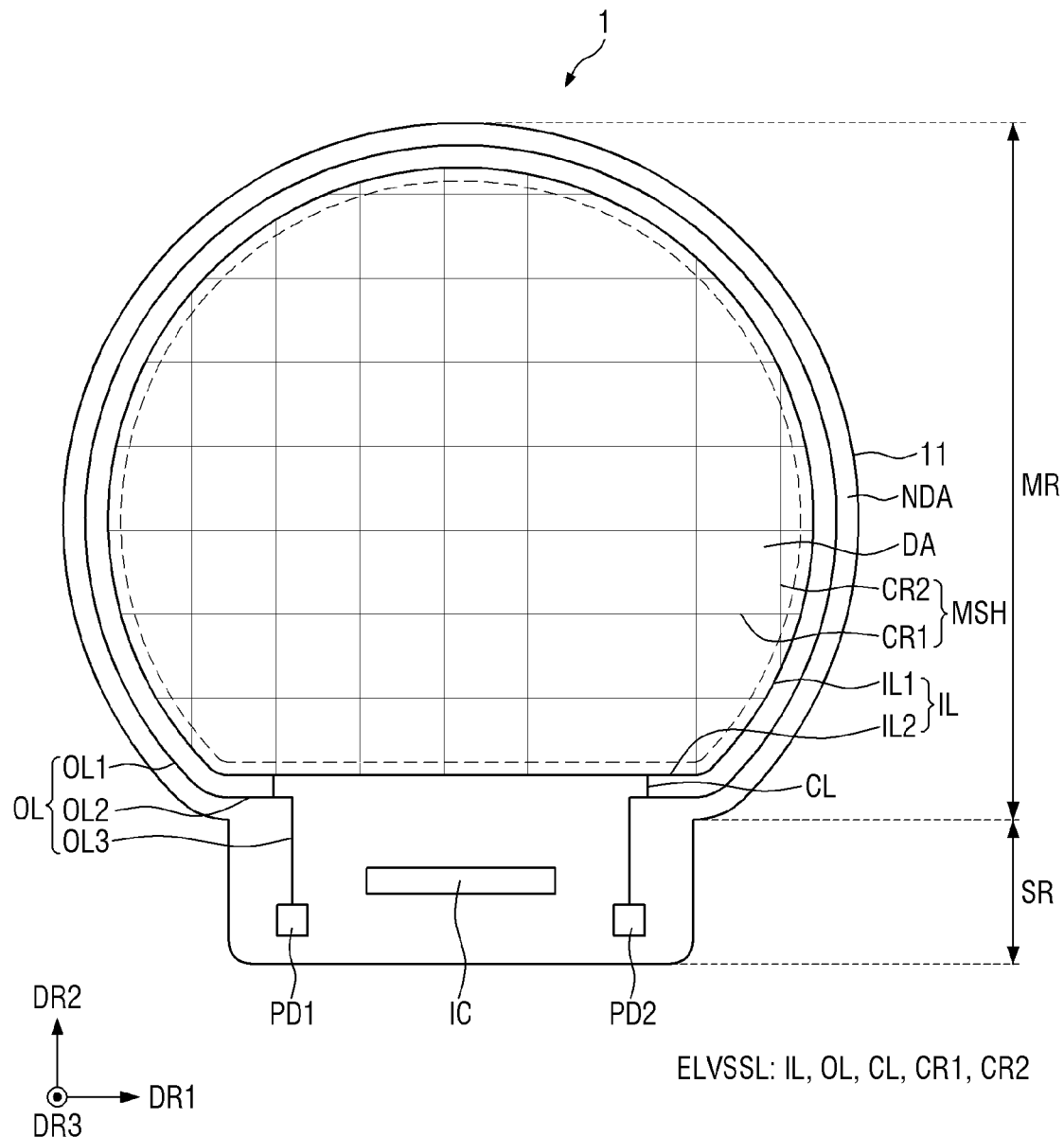

[FIG. 6]
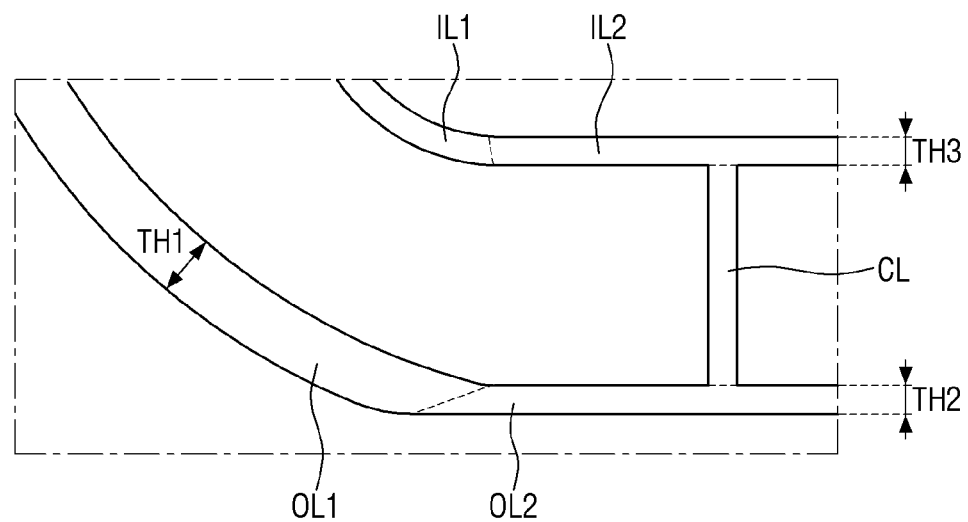

[FIG. 7]
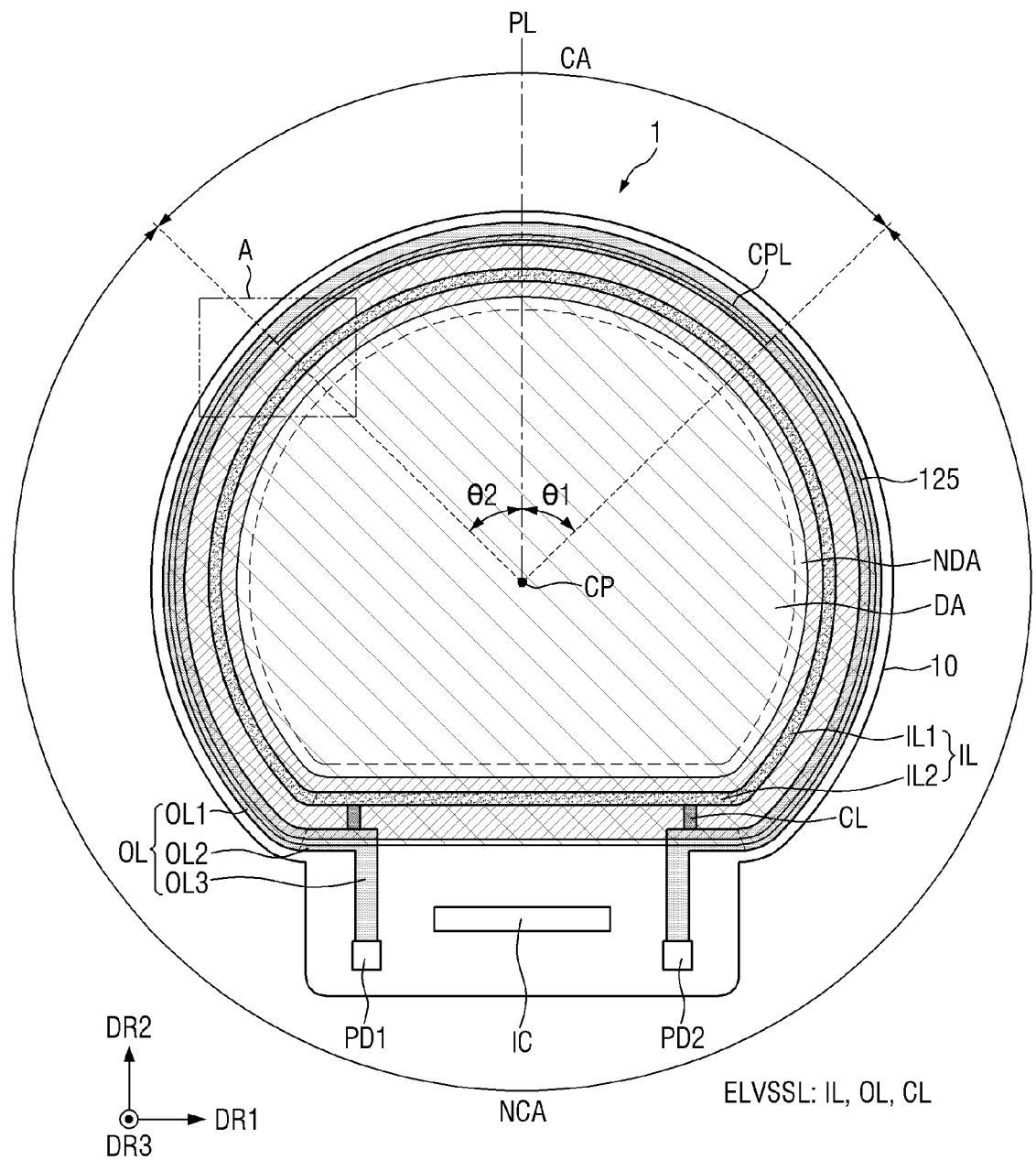

[FIG. 8]
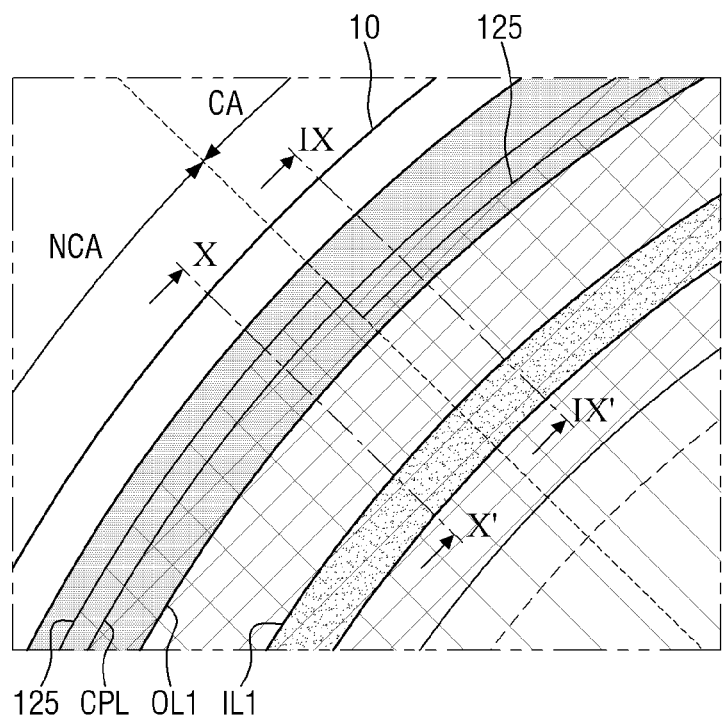

[FIG. 9]
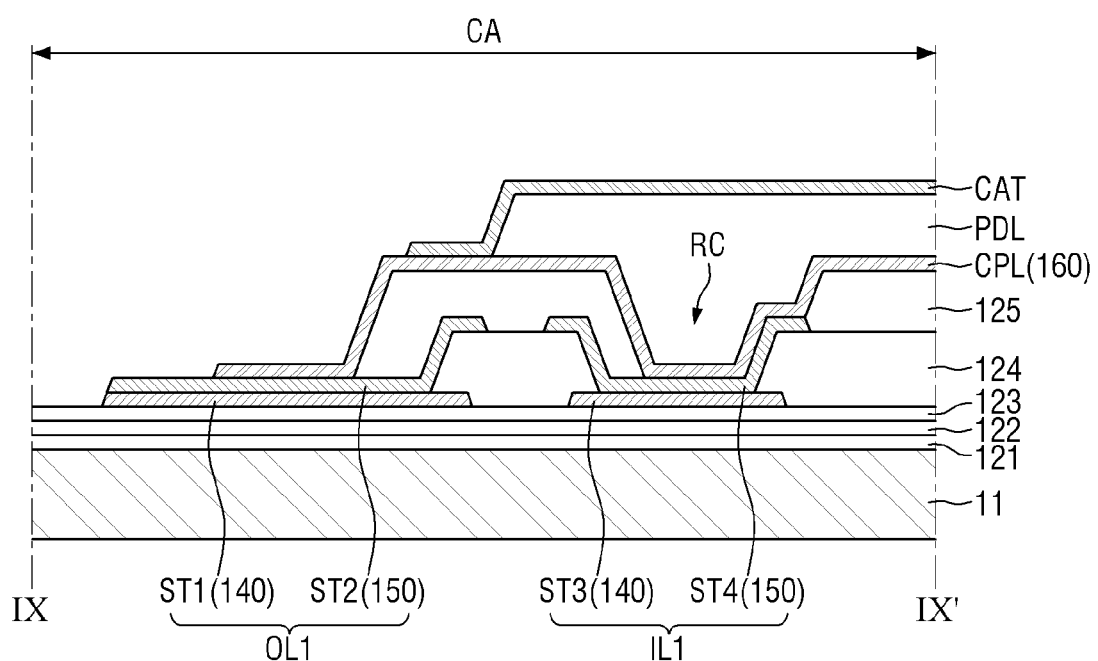

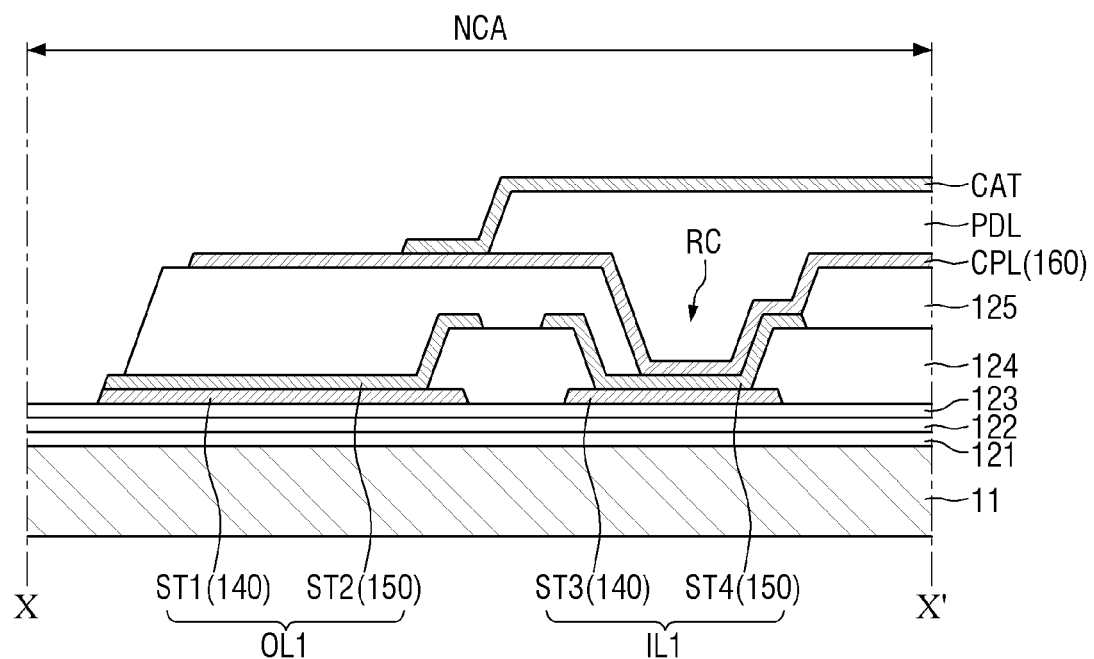
[FIG. 10]

[FIG. 11]
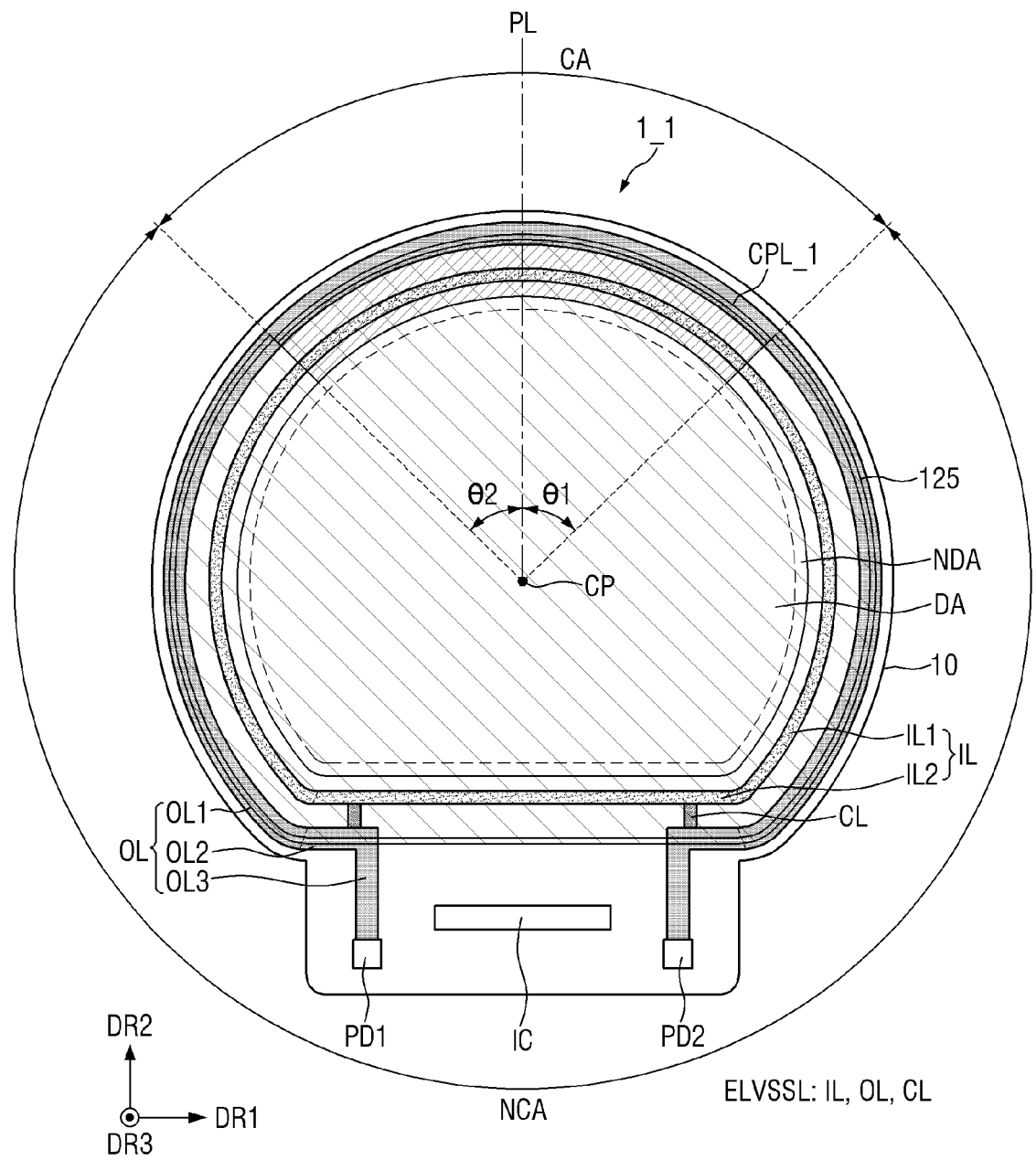

[FIG. 12]
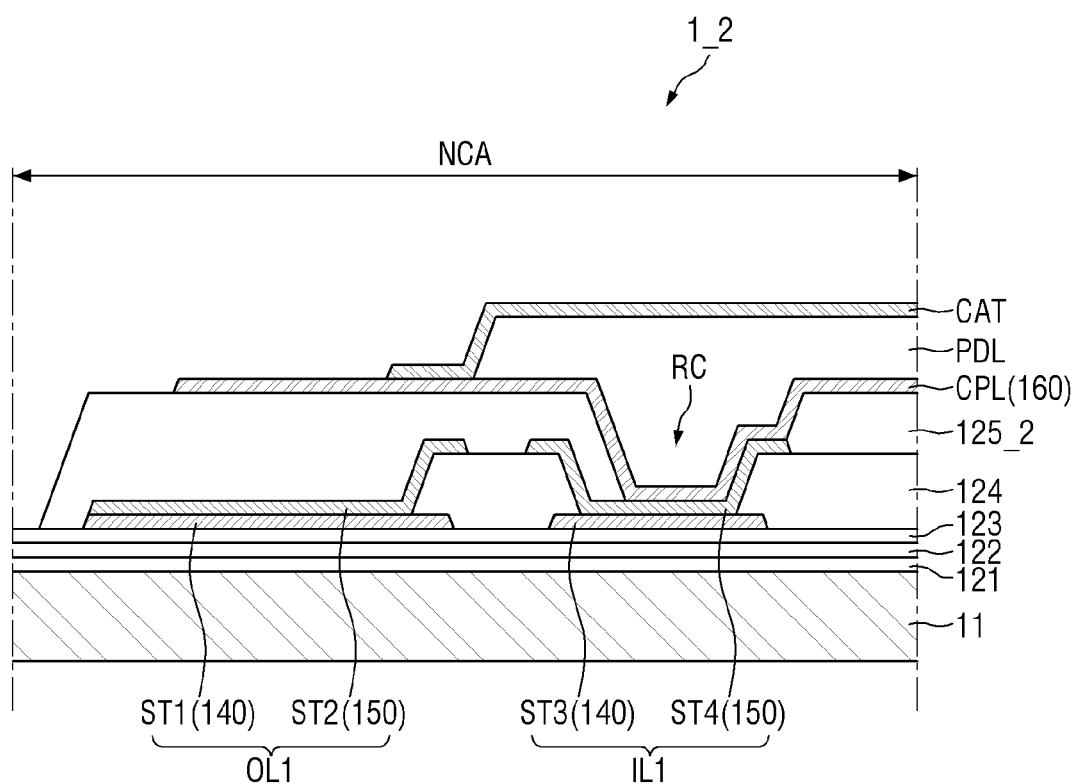

[FIG. 13]
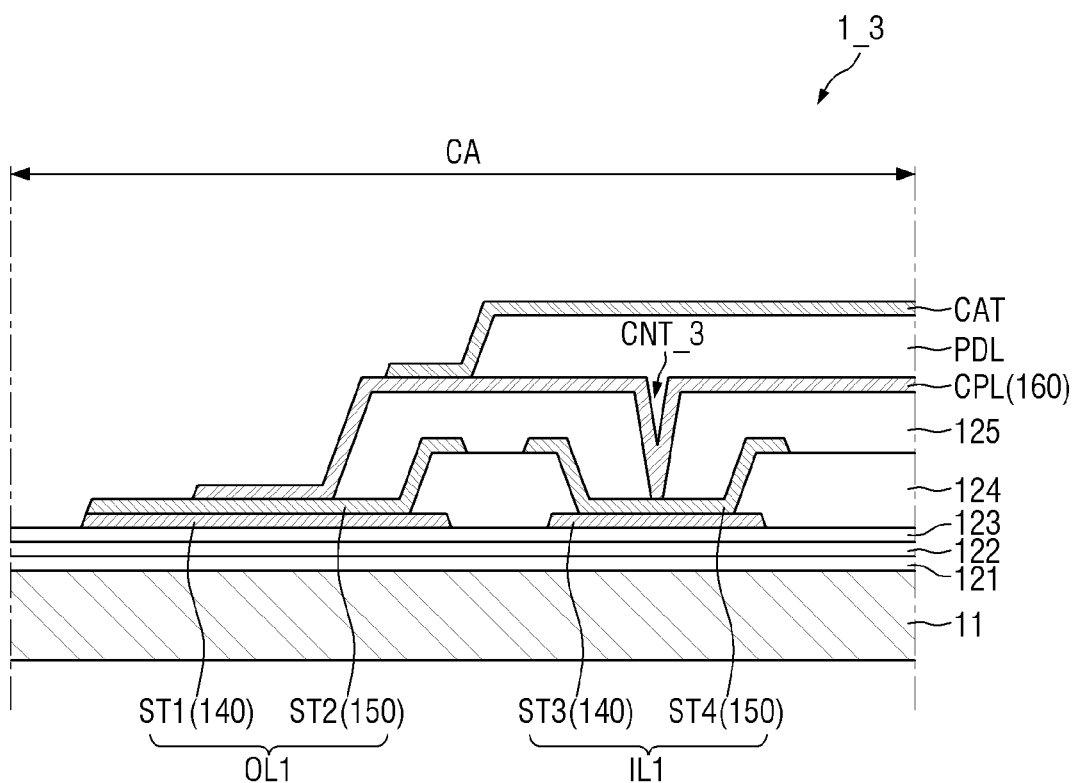

DISPLAY DEVICE WITH MINIMIZED NON-DISPLAY PORTION IN BEZEL AREA

This application claims priority to Korean Patent Application No. 10-2021-0047822 filed on Apr. 13, 2021, and all the benefits accruing therefrom under 35 U.S.C. § 119, the content of which in its entirety is herein incorporated by reference.

BACKGROUND

1. Field

Embodiments of the invention relate to a display device.

2. Description of Related Art

As an information society develops, demand for a display device for displaying an image is increasing in various forms. The display device is applied to various electronic devices such as smart phones, digital cameras, notebook computers, navigation systems, smart televisions, and vehicle dashboards.

The display device may include various types of display devices such as a liquid crystal display device, and an organic light-emitting display device. The organic light-emitting display device displays an image using an organic light-emitting element that generates light via recombination of electrons and holes. The organic light-emitting display device includes a plurality of transistors that provide a driving current to the organic light-emitting element.

Recently, in the display device, a non-display area or a bezel area other than a display area is minimized in order to widen the display area in which light emitting units for displaying an image are arranged.

SUMMARY

As a non-display area or the bezel area is minimized, a width of a power line disposed in the non-display area or the bezel area may decrease. In this case, a resistance of the power line increases, and a current is concentrated on a bottleneck section of the power line, such that heat may be generated in the power line.

A feature of the invention is to provide a display device that may prevent or reduce the heat generation in the power line.

Features of the invention are not limited to the purpose as mentioned above. Other technical purposes as not mentioned will be clearly understood by those skilled in the art from following descriptions.

An embodiment of a display device includes a display area which displays a screen, an inner line disposed outside the display area, and extending to surround the display area, an outer line disposed outside the inner line, a contact pattern overlapping with the inner line and the outer line and electrically connecting the inner line and the outer line to each other, and a connection line disposed between the inner line and the outer line to electrically connect the inner line and the outer line to each other, a contact area where the contact pattern overlaps with the outer line and physically contact the outer line, and a non-contact area where the contact pattern overlaps with the outer line and does not physically contact the outer line. The connection line is disposed within the non-contact area.

An embodiment of a display device includes a substrate, an outer line which is disposed on the substrate and to which a power voltage is applied, an inner line disposed on the substrate and surrounded with the outer line, a first insulating layer disposed on the outer line and the inner line, a contact pattern disposed on the first insulating layer, an anode disposed on the first insulating layer, and spaced apart from the contact pattern, a pixel defining film disposed on the anode and exposing a portion of the anode, a light-emitting layer disposed on the portion of the anode exposed through the pixel defining film, and a cathode disposed on the light-emitting layer, and electrically connected to the outer line, a first area in which an outer face of the contact pattern is disposed outwardly beyond an outer face of the first insulating layer, and a second area in which an outer face of the first insulating layer is disposed outwardly beyond an outer face of the contact pattern.

An embodiment of a display device includes a display area which displays a screen, an inner line disposed outside the display area, at least one of a first line and a second line perpendicular to the first line, where the at least one of the first line and the second line is connected to the inner line and extends across the display area, an outer line disposed outside the inner line, where the outer line includes a first outer line having a first width, and second outer line having a second width smaller than the first width, a contact pattern electrically connecting the first outer line and the inner line to each other, and a connection line electrically connecting second outer line and the inner line to each other, where the inner line and the outer line are connected to each other via the contact pattern and the connection line.

According to the display device in an embodiment, the heat generation in the power line may be prevented or reduced.

Effects in the embodiments are not limited to the effect as mentioned above. Other various effects are included herein.

BRIEF DESCRIPTION OF DRAWINGS

The above and other exemplary embodiments, advantages and features of this disclosure will become more apparent by describing in further detail exemplary embodiments thereof with reference to the accompanying drawings.

FIG. 1 is a plan view of an embodiment of a display device.

FIG. 2 is a cross-sectional view taken along line II-II' in FIG. 1.

FIG. 2 schematically shows a cross-sectional view of an embodiment of a display device.

FIG. 3 is a circuit diagram of one pixel of an embodiment of a display device.

FIG. 4 is a cross-sectional view of an embodiment of one pixel of a display panel.

FIG. 5 is a schematic plan layout diagram of an embodiment of a second power voltage line.

FIG. 6 is an enlarged view of an embodiment of a portion around a point where a first outer line and a second outer line are connected to each other.

FIG. 7 is a plan view showing an embodiment of an overlapping relationship of an outer line, an inner line, a contact pattern, and a fifth insulating layer.

FIG. 8 is an enlarged view of an area A in FIG. 7.

FIG. 9 is a cross-sectional view taken along line IX-IX' in FIG. 8.

FIG. 10 is a cross-sectional view taken along line X-X' in FIG. 8.

FIG. 11 is a plan view of another embodiment of a display device.

FIG. 12 is a cross-sectional view of another embodiment of a display device.

FIG. 13 is a cross-sectional view of another embodiment of a display device.

DETAILED DESCRIPTIONS

Embodiments of the invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification. In the attached drawing figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Hereinafter, embodiments will be described with reference to the accompanying drawings.

FIG. 1 is a plan view of an embodiment of a display device. FIG. 2 is a cross-sectional view taken along line II-II' in FIG. 1. FIG. 2 schematically shows a cross-sectional view of an embodiment of a display device.

In an embodiment, a first direction DR1 and a second direction DR2 respectively represent different directions that intersect each other, for example, in a perpendicular manner to each other in a plan view. A third direction DR3 refers to a direction perpendicular to a plane defined by the first direction DR1 and the second direction DR2, for example, represents a direction normal to the plane defined by the first direction DR1 and the second direction DR2. In the illustrated drawing, the first direction DR1 represents a horizontal direction of the display device 1, the second direction DR2 represents a vertical direction of display device 1, and the third direction DR3 represents a thickness direction of the display device 1.

In following embodiments, one side in the first direction DR1 refers to a right side in the plan view, an opposite side in the first direction DR1 refers to a left side in the plan view, one side in the second direction DR2 refers to a top in the plan view, an opposite side in the second direction DR2 refers to a bottom in the plan view, one side in the third direction DR3 refers to a top in the cross-sectional view, and an opposite side in the third direction DR3 refers to a bottom in the cross-sectional view. In addition, herein, unless otherwise defined, a top face or a top in the third direction DR3 refers to a display face of a display panel 10, while a bottom face or a bottom in the third direction DR3 is opposite to the display face of display panel 10. However, it should be understood that the direction mentioned in the embodiment refers to a relative direction. Thus, the embodiment is not limited to the direction as mentioned.

Referring to FIG. 1 and FIG. 2, the display device 1 displays a moving image or a still image. A display direction of a main screen may be a direction toward on side in the third direction DR3. In this case, the display device 1 may be embodied as a top emission type display device. However, the invention is not limited thereto.

The display device 1 may refer to any electronic device that provides a display screen.

In an embodiment, the display device 1 may include not only portable electronic devices such as mobile phones, smart phones, tablet personal computers ("PCs"), electronic watches, smart watches, watch phones, mobile communication terminals, electronic notebooks, e-books, portable multimedia players ("PMPs"), navigation devices, game consoles or digital cameras that provide a display screen, but also televisions, laptops, monitors, billboards, internet of things ("IoT"), and vehicle display devices. A type of the display device 1 to which a technical idea of the invention may be applied is not limited thereto, for example.

In a plan view, at least a portion of the display device 1 may have a partially curved shape, e.g., a partial circular shape. In other words, in a plan view, the display device 1 may include at least a portion of a full circle. However, the invention is not limited thereto. In a plan view, the display device 1 may include a fully curved shape (e.g., full circle shape), or a polygonal shape such as a rectangle.

The display device 1 includes a display area DA and a non-display area NDA. The display area DA may display a screen, and the non-display area NDA may not display the screen. When the display device 1 has a touch function, a touch area where a touch input is sensed may be included in the display area DA. The display area DA and the touch area may overlap each other. The display area DA may refer to an area in which an image is displayed and the touch input is also detected.

The display area DA may include a plurality of pixels. The plurality of pixels may be arranged in a matrix form. A shape of each pixel may be a rectangle or a square in a plan view. However, the invention is not limited thereto. The shape of each pixel may be a rhombus shape in which each side is inclined with respect to the second direction DR2. The pixel may include a light-emitting area ('EMA' in FIG. 4) and a non-light-emitting area ('NEM' in FIG. 4).

In a plan view, the display area DA may include a partial circular shape. In other words, in a plan view, the display area DA may include a shape obtained by removing a portion of an opposite side in the second direction DR2 from a circular shape. Along an outer periphery of the display area DA, a portion in the opposite side in the second direction DR2 may extend in the first direction DR1, and a remaining portion of the outer periphery may have an open-curved shape in a plan view. In an embodiment, at least a portion of the outer periphery of the display area DA may have a partial circle shape which is partially open, and a remaining portion of the outer periphery of the display area DA may connect both ends of the partial circular shape to each other, for example. However, the invention is not limited thereto. In a plan view, the display area DA may include a full circle shape, or a polygon shape such as a triangle or a rectangle.

The non-display area NDA is disposed around the display area DA. The non-display area NDA may be a bezel area. The non-display area NDA may overlap with a printed layer ('22' of FIG. 2) of a window member ('20' in FIG. 2) to be described later.

The non-display area NDA may surround the display area DA. The non-display area NDA may be disposed outside the display area DA. However, the invention is not limited thereto. The non-display area NDA may not be disposed along a partial outer periphery of the display area DA. Signal lines or driving circuits for applying signals to the display area DA may be disposed in the non-display area NDA.

The display device 1 includes the display panel 10 that provides a display screen, a touch member TSP, an anti-reflective member POL, and a window member 20.

The display panel 10 may include an organic light-emitting display panel, an inorganic light-emitting display panel, a micro light-emitting diode display panel, a nano light-emitting diode display panel, a quantum dot light-emitting display panel, a liquid crystal display panel, a plasma display panel, a field emission display panel, an electrophoretic display panel, an electrowetting display panel, etc. Hereinafter, an example in which the display panel 10 is embodied as the organic light-emitting display panel is described. However, the invention is not limited thereto. The technical idea of the invention may be applicable to other display panels.

The display panel 10 may include a main area MR and an auxiliary area SR protruding from the main area MR. The main area MR may have a shape similar to that of the display device 1 in a plan view. In a plan view, the main area MR may include a portion of a circle shape.

The main area MR may include the display area DA. The display area DA may be disposed within the main area MR. In an embodiment, an edge portion around the display area DA in the main area MR and an entirety of the auxiliary area SR may act as the non-display area NDA. However, the invention is not limited thereto. At least a portion of the auxiliary area SR may include the display area DA.

The auxiliary area SR may protrude from the main area MR toward the opposite side in the second direction DR2. In a plan view, the auxiliary area SR may include an a quadrangular (e.g., rectangular) shape. However, the invention is not limited thereto. In some embodiments, in a plan view, the display panel 10 may include a circle shape, and the main area MR and the auxiliary area SR together may form a circle shape in a plan view. In this case, the auxiliary area SR may include a partial circular shape in a plan view.

In an embodiment, a driving chip IC may be disposed in the non-display area NDA. The driving chip IC may be disposed in the auxiliary area SR. The driving chip IC may be disposed (e.g., mounted) directly on a protruding area of a first substrate 11 protruding from a second substrate 12. The driving chip IC may include an integrated circuit driving the display panel 10. The integrated circuit may include an integrated circuit for a display and/or an integrated circuit for a touch member TSP.

The display panel 10 may further include the first substrate 11, the second substrate 12, an active element layer ATL and a sealing member SEAL.

The first substrate 11 may support the active element layer ATL disposed on a top face thereof. The first substrate 11 may be generally transparent and may have high light transmittance. The first substrate 11 may not be limited to, but may include, for example, an inorganic material such as glass and/or quartz. The inorganic material may not be limited to, but may include, for example, silicon oxide $SiO_2$. However, the invention is not limited thereto. The first substrate 11 may be embodied a transparent plate or a transparent film.

The second substrate 12 may face the first substrate 11, and may be spaced apart from the first substrate 11. The second substrate 12 may protect the active element layer ATL from external moisture and air. The second substrate 12 may be generally transparent and may have high light transmittance. The second substrate 12 may not be limited thereto, but for example, may include an inorganic material such as glass and/or quartz. The inorganic material may not be limited to, but may include, for example, silicon oxide $SiO_2$. However, the invention is not limited thereto. The second substrate 12 may be embodied as a transparent plate or a transparent film. In this case, the second substrate 12 may include at least one inorganic film and at least one organic film. The at least one inorganic film and the at least one organic film together with the first substrate 11 may seal the active element layer ATL. Thus, the sealing member SEAL may be omitted.

The active element layer ATL may be disposed between the first substrate 11 and the second substrate 12. The active element layer ATL may be disposed on a top face of the first substrate 11 or one face thereof. The active element layer ATL may include a light-emitting element and a thin-film transistor ("TFT") driving the same. The active element layer ATL may be spaced apart from the second substrate 12 disposed thereabove. However, the invention is not limited thereto. Detailed descriptions of the active element layer ATL will be made later.

The sealing member SEAL may be disposed between the first substrate 11 and the second substrate 12. In an embodiment, the sealing member SEAL may be disposed in the non-display area NDA of the display device 1 so as to surround the display area DA, for example. The sealing member SEAL may connect the first substrate 11 and the second substrate 12 to each other. The sealing member SEAL together with the first substrate 11 and the second substrate 12 may seal the active element layer ATL. In an embodiment, the sealing member SEAL may include a frit. However, the invention is not limited thereto.

The active element layer ATL may be disposed in an inner area of the display panel 10 defined by the first substrate 11, the second substrate 12 and the sealing member SEAL. The inner area may be in a vacuum state, or may be filled with gas or the like. The gas may not be limited to, but may include, for example, an inert gas or a general atmosphere.

The touch member TSP may be disposed on the display panel 10. The touch member TSP may detect a touch input. The touch member TSP may be disposed on a top face or one face of the second substrate 12. As illustrated in following embodiments, the touch member TSP may be provided in a form of a touch layer which may be integrated with the display panel 10. However, the invention is not limited thereto. The touch member TSP may be embodied as a touch panel or a touch film which may be disposed on the display panel 10. The touch member TSP may include a plurality of touch electrodes. The touch member TSP may be omitted.

The anti-reflective member POL may be disposed on a top face of the touch member TSP. The anti-reflective member POL in a form of a polarizing film may be attached thereto. The anti-reflective member POL polarizes light passing therethrough. The anti-reflective member POL may play a role in reducing external light reflection. However, the invention is not limited thereto. The anti-reflective member POL in a form of an anti-reflective layer may be stacked inside the display panel 10. In this case, the anti-reflective member POL may include a color filter that selectively transmits light of a predetermined wavelength. Further, when the touch member TSP is omitted, the anti-reflective member POL may be attached on the second substrate 12.

The window member 20 is disposed on the anti-reflective member POL. The window member 20 covers and protects the display panel 10. The window member 20 may include a window base 21 and a printed layer 22 disposed on the window base 21. In an embodiment, the window member 20 may be attached onto one face of the display panel 10 via a transparent bonding layer TRL including optical clear adhesive ("OCA") or optical clear resin ("OCR"), etc. When the display device 1 includes or consists of the anti-reflective member POL, the window member 20 may be attached to a top face or one face of the anti-reflective member POL.

The window base 21 may include or consist of a transparent material. The window base 21 may include, for example, glass or plastic.

A plane shape of the window base 21 corresponds to a shape of the display device 1 to which the window base 21 is applied. In an embodiment, when the display device 1 has a partial circular shape in a plan view, the window base 21 also has a partial circular shape, for example. In another embodiment, when the display device 1 has a substantially quadrangular (e.g., rectangular) shape, the window base 21 may also have a substantially quadrangular (e.g., rectangular) shape.

The printed layer 22 may be disposed on the window base 21. The printed layer 22 may be disposed on one face and/or an opposite face of the window base 21. The printed layer 22 may be disposed on an outer periphery area of the window base 21, and may be disposed in the non-display area NDA. The printed layer 22 may act as a light-shielding layer or a decorative layer that imparts aesthetics.

Subsequently, a pixel circuit of the above-described display device 1 and a specific cross-sectional structure of the pixel circuit will be described.

FIG. 3 is a circuit diagram of an embodiment of one pixel of a display device.

Referring to FIG. 3, the pixel circuit may include a first transistor TR1, a second transistor TR2, a capacitor Cst, and an organic light-emitting diode OLED as a light-emitting element. A scan line SL, a data line DL, and a first power voltage line ELVDDL are connected to each pixel circuit. Hereinafter, an example in which the light-emitting element of the display panel 10 is embodied as an organic light-emitting diode OLED will be described. However, the invention is not limited thereto. The light-emitting element may employ various light-emitting elements such as an inorganic light-emitting diode.

The first transistor TR1 may act as a driving transistor, and the second transistor TR2 may act as a switching transistor. In the drawing, each of the first transistor TR1 and the second transistor TR2 is embodied as a p-type metal oxide semiconductor ("PMOS") transistor, for example. However, either or both of the first transistor TR1 and the second transistor TR2 may be embodied as an n-type metal oxide semiconductor ("NMOS") transistor, for example.

A first electrode (source electrode) of the first transistor TR1 may be connected to a first power voltage line ELVDDL to receive a first power voltage ELVDD. A second electrode (drain electrode) of the first transistor TR1 is connected to an anode of the organic light-emitting diode OLED. A source electrode as a first electrode of the second transistor TR2 is connected to the data line DL, and a drain electrode as a second electrode thereof is connected to a gate electrode of the first transistor TR1. The capacitor Cst is connected to and disposed between the gate electrode and the first electrode of the first transistor TR1. A cathode of the organic light-emitting diode OLED is connected to a second power voltage line ELVSSL to receive a second power voltage ELVSS. The second power voltage ELVSS may lower than the first power voltage ELVDD provided from the first power voltage line ELVDDL.

The second power voltage line ELVSSL may extend across the display area DA. Detailed descriptions thereof will be described later.

The second transistor TR2 may output a data signal applied to the data line DL in response to a scan signal applied to the scan line GL. The capacitor Cst may charge therein a voltage corresponding to the data signal received from the second transistor TR2. The first transistor TR1 may control a drive current flowing in the organic light-emitting diode OLED in response to an amount of the charge stored in the capacitor Cst.

The equivalent circuit in FIG. 3 is only one embodiment. The pixel circuit may include a larger number (e.g., seven) of transistors and capacitors.

FIG. 4 is a cross-sectional view of an embodiment of one pixel of a display panel.

Referring to FIG. 4, the active element layer ATL may include a semiconductor layer 110, a first insulating layer 121, a first conductive layer 130, a second insulating layer 122, a second conductive layer 140, a third insulating layer 123, a third conductive layer 150, a fourth insulating layer 124, a fourth conductive layer 160, a fifth insulating layer 125, an anode ANO, a pixel defining film PDL in which an opening is defined to expose the anode ANO, a light-emitting layer EML disposed within the opening of the pixel defining film PDL, and a cathode CAT disposed on the light-emitting layer EML and the pixel defining film PDL. Those layers may be sequentially stacked in the order as described above. In addition, each of the layers may consist of a single layer, or may consist of a multi-layer including a stack of a plurality of layers. Another layer may be further disposed between adjacent layers.

The semiconductor layer 110 is disposed on the first substrate 11. The semiconductor layer 110 acts as a channel of a TFT of a pixel. The semiconductor layer 110 may include polycrystalline silicon. However, the invention is not limited thereto. The semiconductor layer 110 may include single crystal silicon, low temperature polycrystalline silicon, amorphous silicon, or oxide semiconductor. In an embodiment, the oxide semiconductor may include a binary compound ($Ab_x$), a ternary compound ($AB_xC_y$), or a quaternary compound ($AB_xC_yD_z$) including indium, zinc, gallium, tin, titanium, aluminum, hafnium (Hf), zirconium (Zr), or magnesium (Mg), etc.

The first insulating layer 121 is disposed on the semiconductor layer 110. The first insulating layer 121 may act as a first gate insulating layer having a gate insulating function. The first insulating layer 121 may include a silicon compound, a metal oxide, or the like. In an embodiment, the first insulating layer 121 may include silicon oxide, silicon nitride, silicon oxynitride, aluminum oxide, tantalum oxide, hafnium oxide, zirconium oxide, titanium oxide, or the like, for example.

The first conductive layer 130 is disposed on the first insulating layer 121. The first conductive layer 130 may include a gate electrode GAT of a TFT of a pixel, a scan line connected thereto, and a first electrode CE1 of a storage capacitor.

In an embodiment, the first conductive layer 130 may include at least one metal selected from a group including or consisting of copper (Cu), molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), and tungsten (W).

The second insulating layer 122 may be disposed on the first conductive layer 130. The second insulating layer 122 may act as an inter-insulating layer or a second gate insulating layer. The second insulating layer 122 may include an inorganic insulating material such as silicon oxide, silicon nitride, silicon oxynitride, hafnium oxide, aluminum oxide, titanium oxide, tantalum oxide, and zinc oxide.

The second conductive layer 140 is disposed on the second insulating layer 122. The second conductive layer 140 may include a second electrode CE2 of the storage capacitor.

In an embodiment, the second conductive layer 140 may include at least one metal selected from a group including or consisting of copper (Cu), molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), and tungsten (W).

The second conductive layer 140 may include the same material as that of the first conductive layer 130. However, the invention is not limited thereto.

The third insulating layer 123 is disposed on the second conductive layer 140. The third insulating layer 123 may act as an inter-insulating layer. The third insulating layer 123 may include an inorganic insulating material such as silicon oxide, silicon nitride, silicon oxynitride, hafnium oxide, aluminum oxide, titanium oxide, tantalum oxide, and zinc oxide.

The third conductive layer 150 is disposed on the third insulating layer 123. The third conductive layer 150 may include a first electrode SD1 and a second electrode SD2 of a TFT of a pixel. The first electrode SD1 and the second electrode SD2 of the TFT may be respectively and electrically connected to source and drain areas of the semiconductor layer 110 via contact holes extending through the third insulating layer 123, the second insulating layer 122, and the first insulating layer 121. The first power voltage line ELVDDL of the pixel may include or consist of the third conductive layer 150. The first power voltage line ELVDDL may be electrically connected to a second electrode CE2 of the storage capacitor via a contact hole extending through the third insulating layer 123.

In an embodiment, the third conductive layer 150 may include at least one metal selected from a group including or consisting of copper (Cu), molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), and tungsten (W).

The third conductive layer 150 may consist of a single layer or a multilayer layer. In an embodiment, the third conductive layer 150 may be formed in a stack structure such as Ti/Al/Ti, Mo/Al/Mo, Mo/AlGe/Mo, and Ti/Cu, for example.

The fourth insulating layer 124 is disposed on the third conductive layer 150. The fourth insulating layer 124 covers the third conductive layer 150. The fourth insulating layer 124 may act as a via layer. The fourth insulating layer 124 may include an organic insulating material such as polyacrylates resin, epoxy resin, phenolic resin, polyamides resin, polyimides rein, unsaturated polyesters resin, poly phenylenethers resin, polyphenylenesulfides resin, benzocyclobutene ("BCB"), etc.

The fourth conductive layer 160 is disposed on the fourth insulating layer 124. The fourth conductive layer 160 may include an anode connection electrode CNE. The anode connection electrode CNE may be electrically connected to the second electrode SD2 of the TFT via a contact hole extending through the fourth insulating layer 124. The anode ANO and the second electrode SD2 of the TFT may be electrically connected to each other via the anode connection electrode CNE The fourth conductive layer 160 may include at least one metal selected from a group including or consisting of copper (Cu), molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), and tungsten (W). The third conductive layer 150 may include or consist of a single layer or a multilayer layer. The fourth conductive layer 160 may be formed in a stack structure such as Ti/Al/Ti, Mo/Al/Mo, Mo/AlGe/Mo, and Ti/Cu.

The fourth conductive layer 160 may include the same material as that of the third conductive layer 150, or may include the same stack structure as the third conductive layer 150. However, the invention is not limited thereto.

The fifth insulating layer 125 is disposed on the fourth conductive layer 160. The fifth insulating layer 125 covers the fourth conductive layer 160. The fifth insulating layer 125 may act as a via layer. The fifth insulating layer 125 may include an organic insulating material such as polyacrylates resin, epoxy resin, phenolic resin, polyamides resin, polyimides rein, unsaturated polyesters resin, poly phenylenethers resin, polyphenylenesulfides resin, BCB, etc.

The anode ANO is disposed on the fifth insulating layer 125. The anode ANO may act as a pixel electrode provided in each pixel. The anode ANO may be connected to the anode connection electrode CNE via the contact hole extending through the fifth insulating layer 125. The anode ANO may overlap at least a portion of the light-emitting area EMA of the pixel.

The anode ANO may have a stack structure in which a layer including or consisting of a material having a higher work function such as indium-tin-oxide ("ITO"), indium-zinc-oxide ("IZO"), zinc oxide (ZnO), indium oxide ($In_2O_3$), and a reflective material layer including or consisting of silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca) or any combinations thereof are stacked one on top of the other. However, the invention is not limited thereto. In one example, the layer with the higher work function may be disposed on a top face of the reflective material layer and may be closer to the light-emitting layer EML. The anode ANO may have a multilayer structure of ITO/Mg, ITO/MgF, ITO/Ag, and ITO/Ag/ITO. However, the invention is not limited thereto.

The pixel defining film PDL may be disposed on the anode ANO. The opening may be defined in the pixel defining film PDL to expose the anode ANO. The light-emitting area EMA and the non-light-emitting area NEM may be distinguished from each other via the pixel defining film PDL and the opening thereof. In an embodiment, the pixel defining film PDL may include an organic insulating material such as polyacrylates resin, epoxy resin, phenolic resin, polyamides resin, polyimides rein, unsaturated polyesters resin, poly phenylenethers resin, polyphenylenesulfides resin, BCB, etc. In an alternative embodiment, the pixel defining film PDL may include an inorganic material.

The display device 1 may further include a spacer SC. The spacer SC may be disposed on the pixel defining film PDL. The spacer SC may be disposed directly on a top face of the pixel defining film PDL. The spacer Sc may play a role of maintaining a spacing between the pixel defining film PDL and a structure disposed on a top face of the spacer SC.

The light-emitting layer EML is disposed on the anode ANO exposed through the opening of the pixel defining film PDL. The light-emitting layer EML may include an organic material layer. The organic material layer of the light-emitting layer includes an organic light-emitting layer, and may further include a hole injection/transport layer and/or an electron injection/transport layer. However, the invention is not limited thereto. The light-emitting layer EML may be disposed on a portion of the non-light-emitting area NEM. In this case, the light-emitting layer EML may be disposed between the cathode CAT and the pixel defining film PDL and in the non-light-emitting area NEM.

The cathode CAT may be disposed on the light-emitting layer EML. The cathode CAT may act as a common electrode that is disposed across all of the pixels. The anode ANO, the light-emitting layer EML and the cathode CAT may constitute an organic light-emitting element.

The cathode CAT not only contacts the light-emitting layer EML, but also contacts a top face of the pixel defining film PDL. Further, in an area where the spacer SC is formed, the cathode CAT may contact and cover a surface of the spacer SC. The cathode CAT may be formed in a conformal manner to the structure disposed on a bottom face thereof such that the cathode CAT has a step conformal to a step of the structure.

The cathode CAT may include a layer including or consisting of a material having a lower work function, such as Li, Ca, LiF/Ca, LiF/Al, Al, Mg, Ag, Pt, Pd, Ni, Au Nd, Ir, Cr, BaF, Ba or compounds or any combinations thereof (e.g., a combination of Ag and Mg). The cathode CAT may further include a transparent metal oxide layer disposed on the material layer having the lower work function.

The second substrate 12 is disposed on a top face of the cathode CAT.

The second power voltage ELVSS (refer to FIG. 3) may be applied to the cathode CAT via the second power voltage line ELVSSL (refer to FIG. 3). The second power voltage line ELVSSL (refer to FIG. 3) may include an inner line surrounding a mesh pattern, and an outer line. The inner line and the outer line may contact each other in a partial area, and may not contact each other in a remaining area. This configuration may control a current flowing in the inner line and the outer line, and may suppress or prevent heat generation that may otherwise occur in the second power voltage line ELVSSL (refer to FIG. 3).

FIG. 5 is a schematic plan layout diagram of an embodiment of the second power voltage line.

Referring to FIG. 5, the display device 1 may include the second power voltage line ELVSSL and second power voltage pads PD1 and PD2 disposed in the auxiliary area SR. The second power voltage line ELVSSL may receive the second power voltage ELVSS (refer to FIG. 3) via the second power voltage pads PD1 and PD2.

The second power voltage line ELVSSL may include an inner line IL, a horizontal line CR1, a vertical line CR2, an outer line OL, and a connection line CL. Those lines may be electrically connected to each other.

The inner line IL may be disposed in the non-display area NDA. The inner line IL may surround the display area DA. In a plan view, the display area DA may be disposed in an area surrounded with the inner line IL. A planar shape in which the inner line IL extends may correspond to a planar shape of the display area DA.

The inner line IL may include a first inner line IL1 having an open-curved shape in a plan view, and a second inner line IL2 connecting opposite two ends of the first inner line IL1 to each other. The first inner line IL1 may have a partial circle shape in a plan view, while the second inner line IL2 may have a straight shape in a plan view. However, the invention is not limited thereto.

The first inner line IL1 and the second inner line IL2 may have different curvatures. In an embodiment, in a plan view, the first inner line IL1 may have a partial circular shape, and may include a round shape, whereas the second inner line IL2 may have a substantially linear shape and thus have an infinite curvature, for example. However, the invention is not limited thereto.

Each of the horizontal line CR1 and the vertical line CR2 may extend across the display area DA and may be surround with the inner line IL. That is, each of the horizontal line CR1 and the vertical line CR2 may be at least partially disposed in the display area DA. The horizontal line CR1 and the vertical line CR2 may be disposed in an area surrounded with the inner line IL. Each of the horizontal line CR1 and the vertical line CR2 may connect both opposite points on the inner line IL to each other.

In an embodiment, the horizontal line CR1 may extend from one point of the inner line IL at one side in the first direction DR1 to an opposite point thereof at an opposite side in the first direction DR1. The horizontal line CR1 may extend across the display area DA, for example. The vertical line CR2 may extend from one point of the inner line IL at one side in the second direction DR2 to an opposite point thereof at an opposite side in the second direction DR2. The vertical line CR2 may extend across the display area DA. However, the invention is not limited thereto. In another embodiment, only at least one of the horizontal line CR1 and the vertical line CR2 may be disposed.

Each of the horizontal line CR1 and the vertical line CR2 may include a plurality of lines. Each horizontal line CR1 may extend in the first direction DR1. The plurality of horizontal lines CR1 may be repeatedly arranged along the second direction DR2. Each vertical line CR2 may extend in the second direction DR2. The plurality of the vertical lines CR2 may be repeatedly arranged along the first direction DR1.

The second power voltage line ELVSSL may include a mesh pattern MSH. The mesh pattern MSH may be disposed in the display area DA. The mesh pattern MSH may include or consist of the horizontal lines CR1 and the vertical lines CR2. As the second power voltage line ELVSSL includes the mesh pattern MSH, the current flowing in the second power voltage line ELVSSL may be dispersed so that the heat generation may be suppressed. Further, a voltage drop (IR drop) may be suppressed or prevented, such that an operation failure of the display device 1 may be suppressed or prevented.

The outer line OL may be disposed in the non-display area NDA, and may be disposed outside the inner line IL. In a plan view, the outer line OL may include a first outer line OL1 having the open-curved shape, each second outer line OL2 laterally (e.g., horizontally) extending from each of both opposing ends of the first outer line OL1 in a plan view, and each third outer line OL3 connecting each second outer line OL2 to each of the second power voltage pads PD1 and PD2.

In a plan view, the first outer line OL1 may have a partial circular shape. Each second outer line OL2 may extend from each of two opposite ends of the first outer line OL1 inwardly of the display device 1. The second outer lines OL2 extending from one end of the first outer line OL1 and the opposite end of the first outer line OL1 respectively may face each other and may respectively extend towards each other so as to be closer to each other. Each third outer line OL3 may extend from each second outer line OL2 to each of the second power voltage pads PD1 and PD2. The third outer line OL3 may extend from each of the second outer line OL2 toward an opposite side in the second direction DR2, that is, downwardly.

The first outer line OL1 and the second outer line OL2 may have different curvatures. In an embodiment, in a plan view, the first outer line OL1 may have a partial circular shape, and may include a round shape, whereas the second outer line OL2 may have a substantially straight shape and thus, an infinite curvature, for example. However, the invention is not limited thereto.

The first outer line OL1 and the second outer line OL2 may have different line widths from each other.

FIG. 6 is an enlarged view of an embodiment of a portion around a point where the first outer line and the second outer line are connected to each other.

Referring to FIG. 6, the first outer line OL1 may have a first line width TH1, while the second outer line OL2 may have a second line width TH2. The line width may refer to a dimension of the line in a direction perpendicular to a direction in which each line mainly extends in a plan view. The first width TH1 may be greater than the second width TH2. Accordingly, the non-display area NDA where the second outer line OL2 is disposed may be reduced, and, thus, the bezel area may be smaller.

In this case, the current flowing from the first outer line OL1 to the second outer line OL2 may cause a bottleneck at a point where the first outer line OL1 and the second outer line OL2 meet each other. Thus, the heat generation may occur at that point.

However, the outer line OL and the inner line IL may not be electrically connected to each other in at least a partial area. Accordingly, an amount of current flowing in the outer line OL may be reduced, thereby suppressing or prevent the heat generation that may otherwise occur at the point where the first outer line OL1 and the second outer line OL2 meet with each other. Detailed descriptions thereof will be described later.

In addition, the inner line IL may have a third line width TH3. The third width TH3 may be smaller than the first width TH1 and may be smaller than the second width TH2. However, the invention is not limited thereto.

Referring back to FIG. 5, the connection line CL may be disposed between and connected to the outer line OL and the inner line IL. The connection line CL may electrically connect the outer line OL and the inner line IL to each other. The connection line CL may be disposed between and electrically connected to the second outer line OL2 and the second inner line IL2. However, the invention is not limited thereto. The connection line CL may be connected to and disposed between both opposing ends of the second outer line OL2. The connection line CL may be disposed between and connected to the first outer line OL1 and the third outer line OL3.

FIG. 7 is a plan view showing an embodiment of an overlapping relationship of the outer line, the inner line, the contact pattern, and the fifth insulating layer. FIG. 8 is an enlarged view of an area A in FIG. 7.

Referring to FIGS. 7 and 8, the display device 1 may further include a first area CA and a second area NCA that do not overlap with each other. In the first area CA, the contact pattern CPL may contact the outer line OL, whereas in the second area NCA, the contact pattern CPL may not contact the outer line OL. Hereinafter, the first area is also referred to as a contact area CA, and the second area is also referred to as a non-contact area NCA.

In the contact area CA, the outer line OL and the inner line IL may be electrically connected to each other via the contact pattern CPL. In the non-contact area NCA, the outer line OL and the inner line IL may not be electrically connected to each other or may be electrically connected to each other via the connection line CL. The connection line CL may be disposed in the non-contact area NCA, while in an area where the connection line CL is disposed, the outer line OL and the inner line IL may be electrically connected to each other.

Specifically, the display panel 10 may further include the contact pattern CPL. In the contact area CA, the contact pattern CPL may electrically connect the outer line OL and the inner line IL to each other. In the contact area CA, the contact pattern CPL may electrically connect the first outer line OL1 and the first inner line IL1 to each other. In other words, in the non-contact area NCA, the outer line OL and the inner line IL may be electrically connected to each other via the connection line CL, while in the contact area CA, the outer line OL and the inner line IL may be electrically connected to each other via the contact pattern CPL. That is, in the non-contact area NCA, the second outer line OL2 and the second inner line IL2 may be electrically connected to each other via the connection line CL, while in the contact area CA, the first outer line OL1 and the first inner line IL1 may be electrically connected to each other via the contact pattern CPL.

A connection area where the second outer line OL2 and the second inner line IL2 are connected to each other via the connection line CL and a connection area where the first outer line OL1 and the first inner line IL1 are connected to each other via the contact pattern CPL may be separated and spaced apart from each other. That is, the outer line OL and the inner line IL may be connected to each other in a parallel manner via the connection line CL and the contact pattern CPL respectively in the different connection areas.

A portion of the fifth insulating layer 125 disposed in the non-contact area NCA may be spaced apart from a central point CP of the display panel 10 by a spacing larger than a spacing by which a portion of the fifth insulating layer 125 disposed in the contact area CA may be spaced apart from the central point CP of the display panel 10. In other words, an outer face of the portion of the fifth insulating layer 125 in the non-contact area NCA may protrude outwardly beyond an outer face of the portion of the fifth insulating layer 125 in the contact area CA, such that the outer face of the portion of the fifth insulating layer 125 in the non-contact area NCA may be spaced apart from the central point CP of the display panel 10 by a spacing larger than a spacing by which the outer face of the portion of the fifth insulating layer 125 in the contact area CA may be spaced apart from the central point CP.

The contact area CA may be disposed in at least a portion of an area where the outer line OL and the inner line IL are adjacent to each other. In an embodiment, the contact area CA may be disposed in at least a portion of an area in which the first outer line OL1 and the first inner line IL1 are adjacent to each other, for example.

When, in a plan view, the display device 1 has a partial circular shape, the display device 1 may have the central point CP and a virtual vertical line PL extending through the central point CP and extending in the second direction DR2. The central point CP may refer to a central point of a circle shape of the display panel 10 having a partial circular shape. In a plan view, a clockwise angular spacing from the virtual vertical line PL at one side in the second direction DR2 around the central point CP may be referred to as a first angle θ1, while a counterclockwise angular spacing from the virtual vertical line PL may be referred to as a second angle θ2.

In this case, an angular dimension of the contact area CA may be equal to a sum of the first angle θ1 and the second angle θ2, where each of the first angle θ1 and the second angle θ2 is in a range of about 0 degree (°) to about 90°, or in a range of about 0° to about 45°, or in a range of about 0° to about 30°. However, the invention is not limited thereto. The first angle θ1 and the second angle θ2 may be equal to each other. However, the invention is not limited thereto. The non-contact area NCA may refer to an area other than the contact area CA.

The contact area CA and the non-contact area NCA may have different cross-sectional structures. Hereinafter, the cross-sectional structures thereof will be described with reference to FIG. 9 and FIG. 10, respectively.

FIG. 9 is a cross-sectional view taken along line IX-IX' in FIG. 8. FIG. 10 is a cross-sectional view taken along line X-X' in FIG. 8. FIG. 9 shows a cross-sectional view of the contact area CA. FIG. 10 shows a cross-sectional view of the non-contact area NCA. Each of FIG. 9 and FIG. 10 shows both of the pixel defining film PDL and the cathode CAT.

Referring to FIG. 7 to FIG. 10, first, the cross-sectional structure of the contact area CA is described.

In the contact area CA, the contact pattern CPL may overlap with the first outer line OL1 in a thickness direction of the display device. The contact pattern CPL may directly contact the first outer line OL1 in an area overlapping with the first outer line OL1 in the thickness direction. Therefore, in the contact area CA, the contact pattern CPL may physically and/or electrically contact the first outer line OL1.

Further, the cathode CAT may overlap the contact pattern CPL in the thickness direction. In an area in which the cathode CAT overlaps the contact pattern CPL, the cathode CAT may be in direct contact with the contact pattern CPL. Therefore, in the contact area CA, the cathode CAT may physically and/or electrically contact the contact pattern CPL. The cathode CAT may be electrically connected to the first outer line OL1 via the contact pattern CPL.

Specifically, the outer line OL may have a stack structure in which a plurality of layers is stacked. The first outer line OL1 may include a first stacked conductive layer ST1 and a second stacked conductive layer ST2 which are sequentially stacked. The first stacked conductive layer ST1 may include or consist of the second conductive layer 140, and may be disposed on the third insulating layer 123. The second stacked conductive layer ST2 may include or consist of the third conductive layer 150, and may be at least partially disposed on the first stacked conductive layer ST1. Further, the second stacked conductive layer ST2 may be at least partially disposed on the fourth insulating layer 124. However, the invention is not limited thereto. The outer line OL may have a single layer structure.

The first stacked conductive layer ST1 and the second stacked conductive layer ST2 may physically and/or electrically contact each other. The fourth insulating layer 124 may expose at least a portion of the first stacked conductive layer ST1. The second stacked conductive layer ST2 may be in contact with a portion of the first stacked conductive layer ST1 which does not overlap with the fourth insulating layer 124.

A side face (outer face) of the first outer line OL1 may protrude outwardly beyond a side face (outer face) of the fifth insulating layer 125. In other words, the fifth insulating layer 125 may expose at least a portion of the first outer line OL1. The fifth insulating layer 125 may expose an outer portion of the first outer line OL1. The fifth insulating layer 125 may not overlap with the first outer line OL1 in the thickness direction. In an alternative embodiment, when the fifth insulating layer 125 overlaps with the first outer line OL1, the fifth insulating layer 125 may cover only a partial inner area of the first outer line OL1.

The inner line IL may have a stack structure in which a plurality of layers is stacked. The first inner line IL1 may include a third stacked conductive layer ST3 and a fourth stacked conductive layer ST4 which are sequentially stacked. The third stacked conductive layer ST3 may include or consist of the second conductive layer 140, and may be disposed on the third insulating layer 123. The fourth stacked conductive layer ST4 may include or consist of the third conductive layer 150, and may be at least partially disposed on the third stacked conductive layer ST3. However, the invention is not limited thereto. The inner line IL may have a single layer structure.

Further, the fourth stacked conductive layer ST4 may be at least partially disposed on the fourth insulating layer 124. The third stacked conductive layer ST3 and the fourth stacked conductive layer ST4 may physically and/or electrically contact each other. The fourth insulating layer 124 may expose at least a portion of the third stacked conductive layer ST3. The fourth stacked conductive layer ST4 may contact a portion of the third stacked conductive layer ST3 which does not overlap with the fourth insulating layer 124.

The first inner line IL1 may be electrically connected to the first outer line OL1 via the contact pattern CPL. The first inner line IL1 may be electrically connected to the first outer line OL1 via the contact pattern CPL in the contact area CA and the non-contact area NCA.

The contact pattern CPL may be disposed on the fifth insulating layer 125, and may include or consist of a fourth conductive layer 160. The fifth insulating layer 125 may define a recess pattern RC that exposes the first inner line IL1. The recess pattern RC may be defined in the contact area CA and the non-contact area NCA. The recess pattern RC may extend through the fifth insulating layer 125 in the thickness direction. The contact pattern CPL may contact the first inner line IL1 via the recess pattern RC. Accordingly, the contact pattern CPL may be physically and/or electrically connected to the first inner line IL1. The first inner line IL1 may be electrically connected to the first outer line OL1 via the contact pattern CPL.

In the contact area CA, an outer face of the contact pattern CPL may be disposed outwardly beyond an outer face of the fifth insulating layer 125. In other words, the contact pattern CPL may be at least partially disposed on a side face of the fifth insulating layer 125, and may further extend outwardly, and thus may be disposed on a portion of the first outer line OL1 which does not overlap with the fifth insulating layer 125. Accordingly, the contact pattern CPL may contact the first outer line OL1.

An outer face of the pixel defining film PDL may be disposed outwardly beyond an outer face of the cathode CAT. An entire area of the pixel defining film PDL may overlap with the cathode CAT. However, the invention is not limited thereto. The outer face of the pixel defining film PDL may be disposed inwardly of an outer face of the first outer line OL1. The pixel defining film PDL may expose a portion of the first outer line OL1. The outer face of the pixel defining film PDL may be disposed inwardly of an outer face of the fifth insulating layer 125. The pixel defining film PDL may expose a portion of the contact pattern CPL. The cathode CAT may contact the portion of the contact pattern CPL exposed through the pixel defining film PDL.

The cathode CAT may be disposed on the pixel defining film PDL, and may extend outwardly of the display device 1 and thus may be disposed on a portion of the contact pattern CPL that does not overlap with the pixel defining film PDL. Accordingly, the cathode CAT may be physically and/or electrically connected to the contact pattern CPL.

Next, the cross-sectional structure of the non-contact area NCA is described. The cross-sectional structure of the non-contact area NCA is generally similar to the cross-sectional structure of the contact area CA. Therefore, hereinafter, the description of the same configuration therebetween will be omitted or simplified, but rather, following descriptions will focuses on differences therebetween.

In the non-contact area NCA, the contact pattern CPL may overlap with the first outer line OL1 in the thickness direction. In the non-contact area NCA, even when the contact pattern CPL overlaps the first outer line OL1 in the thickness direction, the contact pattern CPL may be electrically insulated from the first outer line OL1. The contact pattern CPL may not be in physical contact with the first outer line OL1 in an area overlapping the first outer line OL1. In the non-contact area NCA, the contact pattern CPL may contact the cathode CAT.

In the non-contact area NCA, an outer face of the fifth insulating layer 125 may be disposed outwardly beyond an outer face of the contact pattern CPL. Accordingly, in the non-contact area NCA, the contact pattern CPL may not contact the first outer line OL1, and may not be physically and/or electrically connected thereto. The fifth insulating layer 125 may be disposed between the first outer line OL1 and the contact pattern CPL. In the non-contact area NCA, the fifth insulating layer 125 may be disposed over an entirety of an area in which the first outer line OL1 and the contact pattern CPL overlap each other.

The fifth insulating layer 125 and the pixel defining film PDL may be patterned via exposure and development. Therefore, when patterning the fifth insulating layer 125 and the pixel defining film PDL, contact or non-contact between the first outer line OL1 and the contact pattern CPL may be controlled.

In addition, in an area where the connection line CL is disposed, the connection line CL and the contact pattern CPL may overlap each other in the thickness direction. However, the fifth insulating layer 125 may be disposed between the connection line CL and the contact pattern CPL in an area where the connection line CL and the contact pattern CPL overlap each other. Accordingly, the connection line CL and the contact pattern CPL may be electrically insulated from each other. In an alternative embodiment, the contact pattern CPL may be disposed only in an area where the first outer line OL1 and the first inner line IL1 are disposed. In this case, the contact pattern CPL may have an open-curved shape in a plan view.

The first outer line OL1 and the first inner line IL1 may be electrically and at least partially connected to each other via the contact pattern CPL. The first outer line OL1 and the first inner line IL1 may not be electrically connected to each other in at least a partial area. Thus, an amount of current flowing in the outer line OL may decrease, while an amount of current flowing through the inner line IL may increase.

In other words, when the first outer line OL1 and the first inner line IL1 are electrically connected to each other over an entire area, the current flowing in the second power voltage line ELVSSL may be concentrated on the outer line OL which has low electrical resistance because the line width of the outer line OL may be relatively larger. In this case, when a width of the second outer line OL2 is smaller than a width of the first outer line OL1, the heat generation may be larger due to the bottleneck at a portion where the first outer line OL1 and the second outer line OL2 meet each other. However, as the first outer line OL1 and the first inner line IL1 are not electrically connected to each other in at least a partial area, an amount of current flowing in the outer line OL may decrease, an amount of current flowing in the inner line IL may increase.

The current flows in the outer line OL due to the second power voltage ELVSS (refer to FIG. 3) applied to the second power voltage pads PD1 and PD2 (refer to FIGS. 5 and 7). As the outer line OL and the inner line IL are electrically connected to each other via the contact pattern CPL in the contact area CA, and are electrically connected to each other via the connection line CL in the non-contact area NCA, the outer line OL and the inner line IL may be connected to each other in a parallel manner. In this case, concentration of the current on the outer line OL may be considerably suppressed, compared to a case when the first outer line OL1 and the first inner line IL1 are electrically connected to each other over the entire area.

TABLE 1

|  | Current amount (milliampere (mA)) of outer line | Current amount (mA) of inner line |
| --- | --- | --- |
| Comparative example | 700 | 68 |
| Present example | 408 | 258 |

TABLE 2

|  | Temperature (degrees Celsius (° C.)) of heat-emission portion in display panel |
| --- | --- |
| Comparative example | 75.0 |
| Present example | 56.2 |

Referring to Tables 1 and 2, the comparative example shows a case where the first outer line OL1 and the first inner line IL1 are electrically connected to each other over the entire area. The present example shows a case where the first outer line OL1 and the first inner line IL1 are not electrically connected to each other in at least a partial area, as in an embodiment. In the present example, each of the first angle θ1 and the second angle θ2 of the contact area CA is about 45°.

Referring to Table 1, in both the comparative example and the present example, the same second power voltage ELVSS (refer to FIG. 3) is applied. When comparing the comparative example with the present example, a current amount flowing in the outer line OL decreases in the present example than in the comparative example. Further, a current amount flowing in the inner line IL increases in the present example than in the comparative example. That is, when the first outer line OL1 and the first inner line IL1 are not electrically connected to each other in at least a partial area, an amount of current flowing through the outer line OL decreases.

Referring to Table 2, in the comparative example and the present example, full white light is emitted from all pixels, and the light emission is maintained for 15 minutes, and then a temperature at a point where the temperature is the highest is measured. In the comparative example and the present example, the highest temperature point is disposed near the second outer line OL2. When comparing the comparative example and the present example with each other, the heat generation in the second outer line OL2 may be reduced in the present example, compared to the comparative example.

Therefore, as the amount of current flowing in the outer line OL decreases, the heat generation in the outer line OL may be suppressed or prevented. Thus, reliability of the display device 1 may be improved.

Hereinafter, other embodiments will be described. In following embodiments, the description of the same configuration as that of the previously described embodiment will be omitted or simplified. Differences therebetween will be mainly described.

FIG. 11 is a plan view of another embodiment of a display device. FIG. 11 shows a layout of the outer line OL, the inner line IL, the contact pattern CPL_1 and the fifth insulating layer 125.

Referring to FIG. 11, a display device 1_1 according to this embodiment is different from that in the embodiment of FIG. 7 in that a contact pattern CPL_1 of the display device 1_1 is disposed only within the contact area CA. Even in this case, as the first outer line OL1 and the first inner line IL1 are not electrically connected to each other in at least a partial area, the amount of current flowing in the outer line OL decreases, such that the heat generation in the outer line OL may be suppressed or prevented. In addition, as the contact pattern CPL_1 is disposed only within the contact area CA, the contact between the first outer line OL1 and the first inner line IL1 in the non-contact area NCA may be more reliably prevented.

FIG. 12 is a cross-sectional view of another embodiment of a display device. FIG. 12 shows an outer portion of the non-contact area of a display device 1_2.

Referring to FIG. 12, a display device 1_2 according to this embodiment is different from that in the embodiment of FIG. 10 in that an outer face of a fifth insulating layer 125_2 of the display device 1_2 is disposed outwardly beyond an outer face of the first outer line OL1 in the non-contact area NCA. In this case, the fifth insulating layer 125_2 may not expose the first outer line OL1. The fifth insulating layer 125_2 may overlap an entire area of the first outer line OL1.

Even in this case, as the first outer line OL1 and the first inner line IL1 are not electrically connected to each other in at least a partial area, the amount of current flowing in the outer line OL decreases, such that the heat generation in the outer line OL may be suppressed or prevented. In addition, as the outer face of the fifth insulating layer 125_2 is disposed outwardly beyond the outer face of the first outer line OL1 in the non-contact area NCA, the contact pattern CPL and the first outer line OL1 may be more reliably insulated from each other.

FIG. 13 is a cross-sectional view of another embodiment of a display device. FIG. 13 shows an outer portion of the contact area CA of a display device 1_3.

Referring to FIG. 13, the display device 1_3 according to this embodiment is different from that in the embodiment of FIG. 9 in that the contact pattern CPL of the display device 1_3 contacts the first inner line IL1 via a contact hole CNT_3. The contact hole CNT_3 may be disposed in the contact area CA. The contact hole CNT_3 may include a plurality of contact holes. Even in this case, as the first outer line OL1 and the first inner line IL1 are not electrically connected to each other in at least a partial area, the amount of current flowing in the outer line OL decreases, such that the heat generation in the outer line OL may be suppressed or prevented. In addition, connecting the first outer line OL1 and the first inner line IL1 in various ways may allow various designs as needed.

In concluding the detailed description, those skilled in the art will appreciate that many variations and modifications may be made to the preferred embodiments without substantially departing from the principles of the invention. Therefore, the disclosed preferred embodiments of the invention are used in a generic and descriptive sense only and not for purposes of limitation.

What is claimed is:

1. A display device comprising:
a display area which displays a screen;
an inner line disposed outside the display area, and surrounding the display area;
an outer line disposed outside the inner line;
a contact pattern overlapping with the inner line and the outer line and electrically connecting the inner line and the outer line to each other so that both of the inner line and the outer line have a power voltage through the contact pattern;
a connection line disposed between the inner line and the outer line and electrically connecting the inner line and the outer line to each other;
a contact area where the contact pattern overlaps with the outer line and physically contact the outer line; and
a non-contact area where the contact pattern overlaps with the outer line and does not physically contact the outer line,
wherein the connection line is disposed within the non-contact area.

2. The display device of claim 1, wherein the outer line includes a first outer line having a first width, and a second outer line having a second width smaller than the first width, and
wherein the first outer line and the inner line are electrically connected to each other via the contact pattern, while the second outer line and the inner line are electrically connected to each other via the connection line.

3. The display device of claim 2, wherein the first outer line and the second outer line have different curvatures from each other.

4. The display device of claim 3, wherein the second outer line is provided in plural,
wherein the first outer line has an open-curved shape in a plan view of the display device, and
wherein the second outer lines respectively extend from both opposing ends of the first outer line and towards each other.

5. The display device of claim 4, wherein the inner line includes a first inner line having an open-curved shape in the plan view, and a second inner line connecting both opposing ends of the first inner line to each other,
wherein the first inner line is electrically connected to the first outer line via the contact pattern, and
wherein the second inner line is electrically connected to the second outer line via the connection line.

6. The display device of claim 1, further comprising:
a first insulating layer disposed between the outer line and the contact pattern in a thickness direction which is perpendicular to a main plane extension direction of the display device,
wherein in the contact area, an outer face of the contact pattern is disposed outwardly beyond an outer face of the first insulating layer, and
wherein in the non-contact area, the outer face of the first insulating layer is disposed outwardly beyond an outer face of the contact pattern.

7. The display device of claim 6, wherein a recess pattern is defined by the first insulating layer and exposes the inner line, and
wherein the contact pattern is in contact with the inner line via the recess pattern.

8. The display device of claim 6, wherein the first insulating layer includes an organic insulating material.

9. The display device of claim 1, further comprising:
a pixel disposed within the display area, wherein the pixel includes an anode, a light-emitting layer, and a cathode, and
wherein in the contact area, the cathode is in physical contact with the contact pattern.

10. The display device of claim 9, wherein the contact pattern and the anode includes a same conductive layer.

11. The display device of claim 1, further comprising:
at least one of a first line extending in a first direction and a second line extending in a second direction perpendicular to the first direction,
wherein the at least one of the first line and the second line is connected to the inner line and is disposed in an area surrounded with the inner line, and
wherein each of the first line and the second line extends across the display area.

12. The display device of claim 1, further comprising:
a power voltage pad electrically connected to the outer line,
wherein the outer line receives the power voltage via the power voltage pad.

13. The display device of claim 1, wherein the display area has a partially curved shape in a plan view.

14. The display device of claim 13, further comprising:
a non-display area disposed around the display area,
wherein the inner line, the outer line, the contact pattern and the connection line are disposed in the non-display area.

15. A display device comprising:
a substrate;
an outer line which is disposed on the substrate and to which a power voltage is applied;
an inner line disposed on the substrate and disposed inside the outer line;
a first insulating layer disposed on the outer line and the inner line;
a contact pattern disposed on the first insulating layer and electrically connecting the inner line and the outer line to each other so that both of the inner line and the outer line have the power voltage through the contact pattern;
an anode disposed on the first insulating layer and spaced apart from the contact pattern;
a pixel defining film disposed on the anode and exposing a portion of the anode;
a light-emitting layer disposed on the portion of the anode exposed through the pixel defining film; and
a cathode disposed on the light-emitting layer, and electrically connected to the outer line,
a first area in which an outer face of the contact pattern is disposed outwardly beyond an outer face of the first insulating layer; and
a second area in which an outer face of the first insulating layer is disposed outwardly beyond an outer face of the contact pattern.

16. The display device of claim 15, wherein in the first area, the contact pattern is in physical contact with the outer line while overlapping with the outer line, and wherein in the second area, the contact pattern overlaps the outer line and does not physically contact the outer line.

17. The display device of claim 16, further comprising:
a connection line disposed in the second area,
wherein the connection line electrically connects the outer line and the inner line to each other.

18. The display device of claim 17, wherein the outer line includes a first outer line having a first width, and a second outer line having a second width smaller than the first width,
wherein the first outer line and the inner line are electrically connected to each other via the contact pattern, and
wherein the second outer line and the inner line are electrically connected to each other via the connection line.

19. The display device of claim 15, wherein the first insulating film includes an organic insulating material.

20. The display device of claim 15, further comprising:
a display area for displaying a screen, and a non-display area disposed around the display area,
wherein the outer line, the inner line and the contact pattern are disposed in the non-display area.

21. A display device including:
a display area which displays a screen;
an inner line disposed outside the display area;
at least one of a first line and a second line perpendicular to the first line, the at least one of the first line and the second line being connected to the inner line and extending across the display area;
an outer line disposed outside the inner line and including:
a first outer line having a first width; and
a second outer line having a second width smaller than the first width;
a contact pattern electrically connecting the first outer line and the inner line to each other; and
a connection line electrically connecting the second outer line and the inner line to each other,
wherein the inner line and the outer line are connected to each other via the contact pattern and the connection line respectively in different connection areas.

22. The display device of claim 21, further comprising:
a contact area in which the contact pattern physically contact the outer line while the contact pattern overlaps the outer line; and
a non-contact area in which the contact pattern does not physically contact the outer line while the contact pattern overlaps the outer line,
wherein the connection line is disposed within the non-contact area.

23. The display device of claim 21, further comprising:
a power voltage pad electrically connected to the outer line,
wherein the outer line receives a power voltage via the power voltage pad.

* * * * *